United States Patent [19]

Asatourian et al.

[11] Patent Number: 5,585,624
[45] Date of Patent: Dec. 17, 1996

[54] APPARATUS AND METHOD FOR MOUNTING AND STABILIZING A HYBRID FOCAL PLANE ARRAY

[75] Inventors: Rolin K. Asatourian, Fullerton; Winfred L. Morris, Thousand Oaks; Donald E. Cooper, Newbury Park; Michael R. James, Thousand Oaks, all of Calif.

[73] Assignee: Rockwell International Corporation, Seal Beach, Calif.

[21] Appl. No.: 409,230

[22] Filed: Mar. 23, 1995

[51] Int. Cl.$^6$ .................................... H01J 3/14
[52] U.S. Cl. ............... 250/216; 250/370.08; 257/186
[58] Field of Search .................. 250/216, 208.1, 250/208.2, 214.1, 332, 352, 370.08; 257/186, 468–470; 437/3, 5, 247–248

[56] References Cited

U.S. PATENT DOCUMENTS

| | | | |
|---|---|---|---|
| 4,943,491 | 7/1990 | Norton et al. | 250/237.08 |
| 5,308,980 | 5/1994 | Barton | 250/332 |
| 5,365,088 | 11/1994 | Myrosznyk | 257/186 |
| 5,382,797 | 1/1995 | Kunimoto et al. | 250/352 |

OTHER PUBLICATIONS

K. Zouari and Y. C. Lee, "Stress Analysis of the Vertical Interconncet forThree–Dimensional Packaging", Journal Of Electrical Packaging, Sep. 1991, vol. 113, pp. 233–239.

Tsung–Yu Pan and Yi–Hsin, Pao, "Stress Analysis of Multilayer Stacked Asemblies", Presented At The Winter Annual Meeting San Francisco, California–Dec. 10–15, 1989, pp. 1–5.

Yi–Hsin Pao and Ellen Eisele, "Interfacial Shear and Peel Stresses in Multilayered Thin Stacks Subjected to Uniform Thermal Loading", Transactions Of The ASME, Jun. 1991, pp. 164–172.

An–Yu Kuo and Kuan–Luen Chen, "Effects of Thickness on Thermal Stresses in a Thin Solder or Adhesive Layer", Presented At The Winter Annual Meeting Dec. 1–6, 1991 Atlanta, GA, pp. 1–6.

E. Subir, "Technical Briefs", Predicted Residual Bow of Thin Plastic Packages of Integrated Circuit Devices, Journal Of Electronic Packaging, Dec. 1992, pp. 467–470.

V. I. Lavrenyuk and V. A. Nakura, "Thermal Stresses In A Multilayer Semiconductor Structure", Jan. 1984 Flemm Publishing Corporation, pp. 1499–1505.

*Primary Examiner*—Que T. Le
*Attorney, Agent, or Firm*—George A. Montanye; David J. Arthur; Susie H. Oh

[57] ABSTRACT

A hybrid focal plane array (FPA) structure including a Balanced Composite Structure (BCS) in which several layers of materials having differing thermal expansion coefficients stabilize the FPA during cryogenic cooling. An optical substrate with a layer of an optically sensitive material detects impinging radiation. The optically sensitive material is coupled to a multiplexer (MUX) substrate via interconnection bumps. The MUX is bonded to a layer of a material having a high TEC. A rigid core layer is sandwiched between the MUX and a balancing layer formed of a material having similar mechanical and geometrical characteristics to the MUX substrate. The three-layer BCS consisting of the MUX, the rigid core layer and the balancing layer is designed to have an effective TEC matching that of the optical substrate. The bumps and the optically sensitive material are thus protected from undesirable stresses generated during thermal excursions, thereby resulting in substantially improved FPA reliability.

29 Claims, 2 Drawing Sheets

APPARATUS AND METHOD FOR MOUNTING AND STABILIZING A HYBRID FOCAL PLANE ARRAY

BACKGROUND OF THE INVENTION

1. Field of the Invention

The present invention relates to stabilizing and supporting a focal plane array (FPA) on a mounting platform. More particularly, the present invention provides for enhanced reliability of the FPA throughout thermal cycling processes during which temperature-induced contraction and expansion between dissimilar materials comprising the FPA may significantly vary.

2. Description of Related Art

A further discussion of FPA mounting and stabilization techniques is described in copending application entitled "Hybrid Focal Plane Array Stabilization and Isolation Scheme," Serial No. 08/409,229, filed Mar. 23, 1995, and invented by R. K. Asatourian. The disclosure of the aforementioned copending application is incorporated herein by reference.

Hybrid FPAs, by definition, are formed of a variety of different materials having differing coefficients of thermal expansion. Accordingly, the conventional layering scheme of such FPAs often causes the materials incorporated in the FPA to be distorted and deflected as the result of the potentially wide changes in temperatures applied to the FPA.

As illustrated in FIG. 1, FPAs typically include several different layers of materials, such as an optical substrate layer 100 coated with an optically-sensitive material 102, an interconnecting scheme typically formed of pliable conducting bumps 104, and an electronic means 106, such as a multiplexer (MUX) layer which includes the FPA electronics. The above-described materials of the FPA are mounted on a platform or base 110 in a layered arrangement over a full-faced epoxy layer 108. The system is cooled by cooling the mounting platform which, in turn, cools the FPA. The infrared radiation enters the optical substrate layer and is detected by the layer of optically-sensitive material.

However, like any system of dissimilar materials exposed to thermal excursions, the FPA and its mounting configuration must meet predetermined thermal cycling reliability objectives of a particular application. If temperature variations are sufficiently great and the thermal expansion coefficients (TECs) of the materials used in the FPA are substantially different, damage to the interconnection scheme between each of the layers of the FPA and the optically sensitive material can occur after a number of cycles.

For example, the hybrid interface of the FPA, e.g., the interconnecting bumps between the detector layer and the MUX, is pliable and thermal contraction can damage these interconnections which form the electrical and mechanical contacts for each pixel of the FPA. Large strains on the interconnect bumps may break the connections, opening the electrical contact between the two layers. Stresses in this region can also lead to damage of the optically sensitive detector layer, reducing its photo-response and increasing the noise.

More particularly, with regard to lateral, or in-plane, deformations of the interconnect bumps, it has been found that such deformations are typically caused by the difference in the contraction rate of the hybrid FPA components. In addition to in-plane deformation, such contraction rate differences can induce out-of-plane forces on the FPA leading to bowing of the FPA. For example, in a typical hybrid FPA in which the detector material has a TEC higher than the MUX, the hybrid FPA will assume a concave deflection or bow when cooled. Furthermore, this undesirable bowing may be affected by the mounting of the hybrid FPA on a supporting platform, such as the cold plate of a dewar. The deformations experienced by the mounting platform may then be transmitted to the FPA, and may increase or decrease the FPA bow depending on the direction of deflection of the platform. Thus, due to the mismatch of TECs of various layers in the FPA and the platform, as well as the deflections of the platform itself, the interconnect bumps may experience both an in-plane and an out-of-plane deformation leading to their work-hardening, fatigue with thermal cycling, and eventual fracture or separation.

One approach used to reduce damage to the interconnect bumps has been to backfill the space between the MUX and the detector with epoxy. This epoxy takes some of the mechanical load off the bumps, and helps to hold the MUX and the detector layers together, thereby reducing bump damage. However, the back-fill epoxy, which generally has a TEC that is higher than both the MUX and the optical substrate forming the detector, also has a tendency to produce normal tension on the bumps. Since the epoxy adheres to the surface of the optically sensitive material, it tends to strain the layer and degrade its characteristics.

In another approach, the MUX is forced to comply with the TEC of the detector optical substrate by mounting a thin MUX on a rigid material which has a TEC which matches that of the detector substrate. Although this approach tends to be less stressful on the optically sensitive material, certain practical challenges are introduced when the MUX circuitry and interconnect bumps are processed on a thin layer, or when the MUX layer is thinned after the electronic circuitry and bumps have been fabricated. In addition, functionality problems have been observed in thin MUXs where the electronic circuitry is subjected to extremely high stress levels both from the thinning process and from the compressive force during cooling. Neither of these approaches are immune to the impact of platform deflections.

SUMMARY OF THE INVENTION

Accordingly, it is an object of the present invention to improve the reliability of a FPA by configuring the FPA mounting arrangement to substantially reduce and limit the amount of distortion and deflection of the materials used in the FPA. In particular embodiments, the present invention is directed to minimizing in-plane and out-of-plane forces on the bumps and the detector of a hybrid FPA.

These and other objectives are accomplished, according to an embodiment of the present invention, by a hybrid FPA arrangement in which temperature excursions do not affect or degrade the performance of the FPA which includes several layers of different materials having different TECs. The hybrid FPA includes an optical substrate with a layer of an optically sensitive material grown on one surface of the substrate. The optically sensitive side of the substrate layer is electrically and mechanically coupled to a MUX chip using interconnection bumps.

The MUX is forced to match the contraction of the optical substrate when cooled by mounting a layer of rigid core material directly beneath the MUX. To counterbalance the bowing that would otherwise result from the TEC mismatch between the MUX and the rigid core material, a balancing layer formed of the same material and having the same thickness as the MUX is bonded to the opposite side of the rigid core layer. The three layers form a Balanced Composite Structure (BCS). The thicknesses of the three layers in the BCS are determined such that the combination of the three layers exhibits an effective TEC which matches that of the optical substrate. The symmetry of the similar layers on both sides of the rigid core prevents the BCS from bowing when cooled. As a result, both the in-plane and out-of-plane forces on the bumps and on the detector, which would otherwise be present when the mismatched layers are cooled, are eliminated.

DETAILED DESCRIPTION OF THE PREFERRED EMBODIMENTS

The following description is of the best presently contemplated mode of carrying out the invention. In the accompanying drawings, like numerals designate like parts in the several figures. This description is made for the purpose of illustrating the general principles of the invention and should not be taken in a limiting sense. The scope of the innovation is best determined by reference to the accompanying claims.

Figure 1:
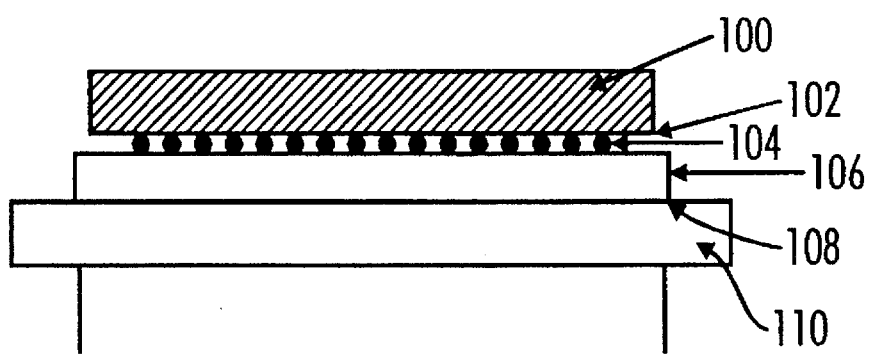
FIG. 1 is a cross-sectional view of a conventional focal plane array.
Figure 2:
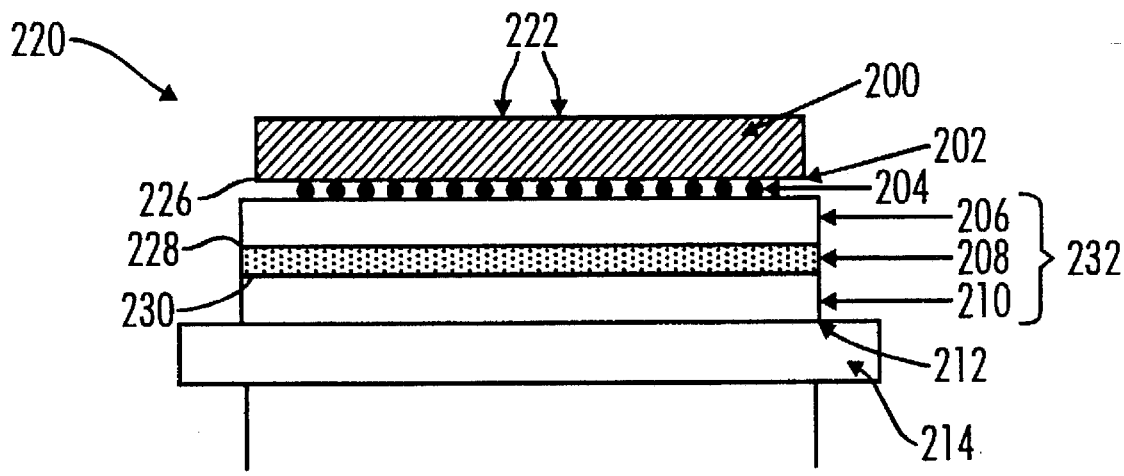
FIG. 2 is a cross-sectional view of a hybrid focal plane array in accordance with a preferred embodiment of the present invention.

A cross-section of a hybrid FPA in accordance with a preferred embodiment of the present invention is indicated in FIG. 2 as reference numeral 220. In the illustrated FPA, light 222 represented as infrared radiation impinges on the surface 226 of an optical substrate 200. The optical substrate is preferably formed of sapphire, cadmium telluride, cadmium zinc telluride or other substances of appropriate transmittance at desired wavelengths. Such wavelengths may cover a certain desired range of the infrared spectrum. For example, in preferred embodiments, the sapphire optical substrate 200 is approximately 0.013 inch thick. The size of the detector optical substrate 200 may vary depending upon the number of pixels in the array, e.g., 128×128 and 1024×1024.

The lower surface 226 of the detector 200 is coated with a thin layer of an optically sensitive material 202. The optically sensitive material 202 is provided to convert photons into electric charge. This electric charge is conducted through an interconnection scheme 204 to a multiplexer (MUX) chip 206. According to preferred embodiments of the present invention, the interconnection scheme 204 is formed by a pair of interconnect "bumps" per pixel. Each interconnect bump is made of a soft, pliable conducting material such as indium (In). One of the bumps in each pair is grown on the detector, and the other is coupled to the MUX at each pixel location. The shape, size and pitch of the bumps may vary depending on the particular application. The MUX and the detector are then mated together in the process of the hybrid FPA fabrication such that each bump on the detector side is aligned with and squashed against the corresponding bump on the MUX side, establishing mechanical as well as an electrical connection.

Preferably, the optically sensitive material comprises a Mercury-Cadmium-Telluride (HgCdTe) compound on a buffering Cadmium-Telluride (CdTe) compound which are grown on the lower surface 226 of the detector optical substrate 200. The photons detected by the HgCdTe layer are converted into electrical charge and transferred through the In bumps to the MUX. The MUX is preferably formed of a silicon (Si) substrate or other semiconducting material, such as gallium arsenide (GaAs), appropriate for fabricating integrated circuits. The MUX contains integrated circuits necessary to convert the electrical charge generated from the incoming photons at each pixel location to an appropriate electrical signal, and to clock out the signals from various pixels in an organized scheme. It will be recognized, however, that the materials and configuration of the MUX substrate, the number of output channels, the signal characteristics, the clocking scheme and its speed will vary depending upon the particular application.

In operation, the FPA is cooled down to cryogenic temperatures every time it is used. During its lifetime, the FPA is exposed to a number of thermal cycles between ambient and cryogenic temperatures. The number of cycles depends on the particular application. In some applications, it is desirable that the FPA be able to survive thousands of thermal cycles with minimal degradation. Consequently, the FPA must be constructed to maintain its mechanical integrity and electrical functionality as it is cooled down repeatedly. However, it is recognized that the larger the hybrid FPA, the higher the stresses caused by the mismatch of TECs of various layers, especially at the edges and corners. Thus, the practical size of hybrid FPAs is limited by reliability problems relating to the mismatch of TECs of the various layers.

Thus, according to preferred embodiments of the present invention, the hybrid FPA is stabilized and protected from undesirable distorting effects of thermal cycling by binding the surface 228 of the MUX 206 opposite the surface facing the interconnect bumps 204, the detector optical substrate 200, and the optically sensitive material 202 to a rigid core material 208, which is itself bonded onto a balancing layer 210. The rigid core layer 208 is preferably formed of stainless steel or other material having a high TEC and high modulus of elasticity. As a consequence, the MUX is forced to contract at a higher rate than it would in an unconstrained configuration.

In preferred embodiments of the invention, the rigid core layer 208 is bonded to the lower surface 228 of the MUX 206 and the upper surface 230 of the balancing layer 210 with a hard epoxy or other extremely rigid, non-slip adhesive. The material used for, and the thickness of the balancing layer 210 is the same as that used in the MUX 206, thus creating the symmetry needed for a stable composite structure.

The MUX layer, the rigid core layer, and the balancing layer form a Balanced Composite Structure (BCS) 232 with two primary features. In preferred embodiments, the effective composite TEC that the BCS exhibits is the same as that of the optical substrate 200. Additionally, due to its symmetry, the BCS does not bow upward, nor does it bow downward because each layer on each side of the rigid core material is balanced by the other. Thus, by eliminating the in-plane and out-of-plane forces acting on the bumps and the detector, the deleterious effects of the inherent mismatch between the TECs of the various materials used in the hybrid FPA is effectively eliminated.

In one embodiment of the invention, the BCS 232 is mounted onto a platform 214 using a secure epoxy layer 212. Preferably, the epoxy 212 is sandwiched between the two surfaces in a full-face configuration, such that the epoxy is spread in a thin layer of uniform thickness over the contact surface of the balancing layer 210. In an alternate embodiment, the BCS 232 is mounted onto the platform 214 using a thick, soft and localized epoxy to reduce the mechanical coupling of the BCS, and thereby the FPA, to the platform. The localized epoxy provides sufficient isolation from the platform to avoid being affected by deleterious deflections of the platform caused during contraction and expansion of the platform materials during cycling, as explained above.

The platform 214 is cooled to cryogenic temperatures by a cold source, such as a cryostat or liquid cryogen. In particular embodiments, the platform 214 is formed of a material, such as ceramic, having a TEC close to that of the optical substrate 200, and having an acceptable thermal conductance to satisfy the desired cool-down rate.

Figure 3:
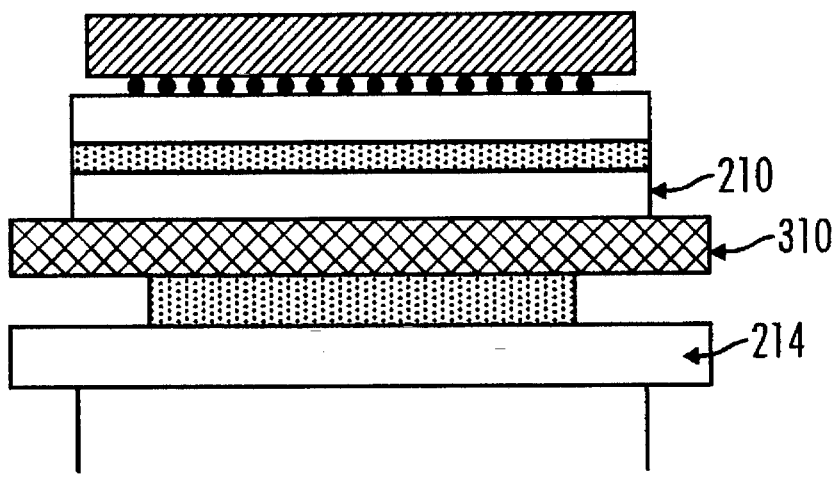
FIG. 3 is a cross-sectional view of a hybrid focal plane array in accordance with an alternate embodiment of the present invention.

Referring to FIG. 3, the hybrid FPA structure is mounted on a carrier 310 which is then mounted to the platform 214. The carrier 310 may be implemented for purposes of geometry or handling. Preferably, the carrier is mounted between the balancing layer 210 and the platform 214 using a soft, thick, localized epoxy. An alternate mounting could be accomplished using a hard, full face epoxy. As discussed above, the material of the carrier must provide adequate thermal conductance to allow conduction of heat into the cold plate 214 at an appropriate rate.

Accordingly, embodiments of the present invention substantially reduce the strain on the bumps and the detector. This is accomplished by forcing the TEC of the MUX to match that of the optical substrate without inducing an undesirable bending. The reliability of the hybrid FPA is thus greatly increased.

It will be recognized that a variety of adhesives may be used to bind the various layers of the BCS-FPA together. Adhesives and other coupling means may be selected to satisfy the TEC, modulus, thermal conductance, out-gassing, curing and other mechanical, thermal, chemical, and economic aspects desired in a particular design.

This detailed description is set forth only for purposes of illustrating examples of the present invention and should not be considered to limit the scope thereof in any way. Clearly numerous additions, substitutions, and other modifications can be made to the invention without departing from the scope of the invention which is defined in the appended claims and equivalents thereof.

What is claimed is:

1. A hybrid Focal Plane Array (FPA) structure for detecting incoming radiation, comprising:
   a detector having an associated rate of contraction, the detector including
     an optically sensitive material for converting the incoming radiation to electrical charge, and
     an optical substrate for supporting the optically sensitive material;
   a Balanced Composite Structure (BCS) coupled to the detector, the BCS including
     electronic means for receiving the electrical charge generated by the optically sensitive material from incoming radiation,
     a rigid core layer bonded to the electronic means, wherein the rigid core layer causes the electronic means to contract at the same rate as the detector upon cooling, and
     a balancing substrate bonded to the rigid core layer, such that the rigid core layer is sandwiched between the balancing substrate and the electronic means, thereby reducing distortion of the electronic means;
   interconnection means for mechanical, electrical, and thermal coupling of the BCS to the detector, such that the radiation detected by the detector is transmitted as electrical charge through the interconnection means to the electronic means; and
   cooling means for supporting the BCS, and for cooling the BCS and detector arrangement.

2. The hybrid FPA of claim 1, wherein the optical substrate includes a first surface and a second surface, the optically sensitive material being located on the second surface of the optical substrate, between the optical substrate and the interconnection means, the radiation entering the first surface of the optical substrate, and further wherein the optically sensitive material absorbs the radiation entering the detector, and converts the radiation into the electrical charge, such that the electrical charge is transmitted through the interconnection means to the electronic means.

3. The hybrid FPA of claim 1, wherein the electronic means contains a conductive scheme for conducting the electrical charge generated by the optically sensitive material out of the electronic means.

4. The hybrid FPA of claim 1, wherein the electronic means contains electronic circuitry for processing the electrical charge generated by the optically sensitive material into electrical signals, and a conductive scheme for conducting the electrical signals out of the electronic means.

5. The hybrid FPA of claim 1, wherein the optical substrate comprises a crystalline material.

6. The hybrid FPA of claim 5, wherein the crystalline material is sapphire.

7. The hybrid FPA of claim 5, wherein the crystalline material is cadmium telluride.

8. The hybrid FPA of claim 5, wherein the crystalline material is cadmium zinc telluride.

9. The hybrid FPA of claim 1, wherein the optically sensitive material comprises a combination of Mercury-Cadmium-Telluride and Cadmium-Telluride compounds.

10. The hybrid FPA of claim 1, wherein the interconnection means is formed of a pliable conducting material.

11. The hybrid FPA of claim 1, wherein the interconnection means comprises a plurality of indium bumps.

12. The electronic means of claim 4, wherein the electronic circuitry comprises a multiplexer formed within a semiconducting substrate.

13. The FPA of claim 1, wherein the semiconducting substrate comprise silicon.

14. The hybrid FPA of claim 1, wherein the cooling means comprises a ceramic material.

15. The hybrid FPA of claim 1, wherein the electronic means and the balancing substrate are made of materials with thermal expansion coefficients (TECs) which are the same or approximately the same, further wherein the rigid core layer bonded between the electronic means and the balancing substrate is made of material with a higher TEC relative to that of the electronic means and the balancing substrate.

16. The hybrid FPA of claim 1, wherein the electronic means and the balancing substrate are made of materials with thermal expansion coefficients (TECs) which are the same or approximately the same, further wherein the rigid core layer bonded between the electronic means and the balancing substrate is made of material with a lower TEC relative to that of the electronics means and the balancing substrate.

17. The hybrid FPA of claim 1, further comprising an adhesive for securely mounting the BCS to the cooling means.

18. The FPA of claim 1, further comprising a carrier coupled between the balancing substrate and the cooling means.

19. A balanced composite focal plane array (FPA) for processing incoming radiation, the FPA comprising:

a detector substrate for receiving and transmitting the incoming radiation, the detector substrate having first and second surfaces, the first surface for receiving the incoming radiation;

an optically sensitive material coupled to the second surface of the optical substrate for absorbing the radiation received by the detector substrate, and for converting the radiation into electrical charge;

a semiconductor substrate coupled to the optically sensitive material, the semiconductor substrate for receiving the electrical charge generated by the optically sensitive material, the semiconductor substrate having a first surface and a second surface;

interconnection means sandwiched between the optically sensitive material and the first surface of the semiconductor substrate, the interconnection means for mechanically and electrically coupling the optically sensitive material to the semiconductor substrate such that the interconnection means transmits the electrical charge through to the semiconductor substrate;

a balancing substrate coupled to the semiconductor substrate to firmly support the semiconductor substrate from distortion and flexure, wherein the balancing substrate is sufficiently rigid to counteract bowing of the semiconductor substrate and the interconnection means, such that the detector substrate is caused to contract proportionally with the semiconductor substrate, whereby any in-plane and out-of-plane forces on the interconnection means and the detector substrate are substantially eliminated; and a platform coupled to the balancing substrate for supporting and cooling the balancing substrate, the semiconductor substrate, and the optical substrate.

20. The FPA of claim 19, further comprising a rigid core layer disposed between the second surface of the semiconductor substrate and the balancing substrate, wherein the semiconductor substrate has an associated thermal expansion coefficient (TEC) and the balancing substrate has a TEC which is similar to the TEC of the semiconductor substrate, and further wherein both the detector substrate and the rigid core layer have higher TECs relative to that of the semiconductor substrate and the balancing substrate, such that the rigid core layer, the semiconductor substrate and the balancing substrate together exhibit a TEC equal or roughly equal to the TEC of the detector substrate during cooling.

21. The FPA of claim 19, wherein the detector substrate comprises a crystalline material.

22. The FPA of claim 19, wherein the optically sensitive material comprises a combination of Mercury-Cadmium-Telluride and Cadmium-Telluride compounds.

23. The FPA of claim 19, wherein the interconnection means is formed of a pliable conducting material.

24. The FPA of claim 23, wherein the interconnection means comprises a plurality of indium bumps.

25. The FPA of claim 19, wherein the semiconductor substrate is formed of silicon, and includes electronic circuitry for processing the electrical charge transmitted through the interconnection means.

26. A method of stabilizing a hybrid focal plane array (FPA) provided with an optical substrate for receiving impinging radiation and an electronic network coupled to the optical substrate for processing the impinging radiation, the method comprising the steps of:

receiving impinging radiation by an optical substrate;

converting the impinging radiation to electrical charge by an optically sensitive material;

connecting the electronic network to the optically sensitive material via an interconnection network of pliable, electrically-conducting material; and mounting the electronic network onto a rigid core layer and a balancing layer such that the thermal expansion rate of the electronic network matches the thermal expansion rate of the optical substrate, and such that the electronic network is mechanically stabilized by the balancing layer and the rigid core layer.

27. The method of claim 26, further comprising the step of cooling the optical substrate, the electronic network, the rigid core layer and the balancing layer.

28. A balanced composite focal plane array (FPA) for processing incoming radiation, the FPA comprising:

a detector substrate for receiving and transmitting the incoming radiation, the detector substrate having first and second surfaces, the first surface for receiving the incoming radiation;

an optically sensitive material coupled to the second surface of the optical substrate for absorbing the radiation received by the detector substrate, and for converting the radiation into electrical charge;

a semiconductor substrate coupled to the optically sensitive material, the semiconductor substrate for receiving the electrical charge generated by the optically sensitive material, the semiconductor substrate having a first surface and a second surface;

interconnection means sandwiched between the optically sensitive material and the first surface of the semiconductor substrate, the interconnection means for mechanically and electrically coupling the optically sensitive material to the semiconductor substrate such that the interconnection means transmits the electrical charge through to the semiconductor substrate;

a balancing substrate coupled to the semiconductor substrate to firmly support the semiconductor substrate from distortion and flexure, the semiconductor substrate having an associated thermal expansion coefficient (TEC) and the balancing substrate having a TEC which is similar to the TEC of the semiconductor substrate, wherein the detector substrate has a higher TEC relative to that of the semiconductor substrate and the balancing substrate, such that the semiconductor substrate and the balancing substrate together exhibit a TEC equal or roughly equal to the TEC of the detector substrate during cooling; and a platform coupled to the balancing substrate for supporting and cooling the balancing substrate, the semiconductor substrate, and the optical substrate.

29. A balanced composite focal plane array (FPA) for processing incoming radiation, the FPA comprising:

a detector substrate for receiving and transmitting the incoming radiation, the detector substrate having first and second surfaces, the first surface for receiving the incoming radiation;

an optically sensitive material coupled to the second surface of the optical substrate for absorbing the radiation received by the detector substrate, and for converting the radiation into electrical charge;

a semiconductor substrate coupled to the optically sensitive material, the semiconductor substrate for receiving the electrical charge generated by the optically sensitive material, the semiconductor substrate having a first surface and a second surface;

interconnection means sandwiched between the optically sensitive material and the first surface of the semiconductor substrate, the interconnection means for mechanically and electrically coupling the optically sensitive material to the semiconductor substrate such that the interconnection means transmits the electrical charge through to the semiconductor substrate;

a balancing substrate coupled to the semiconductor substrate to firmly support the semiconductor substrate from distortion and flexure;

a platform coupled to the balancing substrate for supporting and cooling the balancing substrate, the semiconductor substrate, and the optical substrate;

a rigid core layer disposed between the second surface of the semiconductor substrate and the balancing substrate, the semiconductor substrate having an associated thermal expansion coefficient (TEC) and the balancing substrate having a TEC which is similar to the TEC of the semiconductor substrate, wherein both the detector substrate and the rigid core layer have higher TECs relative to that of the semiconductor substrate and the balancing substrate, such that the rigid core layer, the semiconductor substrate and the balancing substrate together exhibit a TEC equal or roughly equal to the TEC of the detector substrate during cooling.

* * * * *